: US 8,183,619 B1
(45) Date of Patent: May 22, 2012

(12) United States Patent
Chang et al.

(54) METHOD AND SYSTEM FOR PROVIDING CONTACT TO A FIRST POLYSILICON LAYER IN A FLASH MEMORY DEVICE

(76) Inventors: Mark S. Chang, Los Altos, CA (US); Hao Fang, Cupertino, CA (US); King Wai Kelwin Ko, San Jose, CA (US)

( * ) Notice: Subject to any disclaimer, the term of this patent is extended or adjusted under 35 U.S.C. 154(b) by 0 days.

(21) Appl. No.: 09/539,458

(22) Filed: Mar. 30, 2000

(51) Int. Cl.
*H01L 29/76* (2006.01)
*H01L 29/788* (2006.01)

(52) U.S. Cl. ............... 257/315; 257/326; 257/E29.129

(58) Field of Classification Search ............... 257/314, 257/315, 316, 320, 326, E29.129, E29.3
See application file for complete search history.

(56) References Cited

U.S. PATENT DOCUMENTS

| | | | |
|---|---|---|---|
| 4,971,924 A | | 11/1990 | Tigelaar et al. |
| 5,065,220 A | * | 11/1991 | Paterson et al. ............... 257/532 |
| 5,338,969 A | | 8/1994 | Kaya |
| 5,470,775 A | * | 11/1995 | Nariani ............... 438/384 |
| 5,780,333 A | * | 7/1998 | Kim ............... 438/238 |
| 5,939,753 A | * | 8/1999 | Ma et al. ............... 257/339 |
| 5,990,512 A | * | 11/1999 | Diorio et al. ............... 257/314 |
| 6,022,799 A | | 2/2000 | Foote et al. |
| 6,051,501 A | * | 4/2000 | Becker et al. ............... 438/696 |
| 6,197,639 B1 | * | 3/2001 | Lee et al. ............... 438/258 |
| 6,204,116 B1 | * | 3/2001 | Pang ............... 438/253 |
| 6,437,394 B1 | * | 8/2002 | Kawata et al. ............... 257/315 |
| 6,630,707 B1 | * | 10/2003 | Shinmori ............... 257/315 |

* cited by examiner

*Primary Examiner* — Hoai V Pham
(74) *Attorney, Agent, or Firm* — Sterne, Kessler, Goldstein & Fox, PLLC

(57) ABSTRACT

A method and system for providing at least one contact in a flash memory device is disclosed. The flash memory device includes a plurality of gate stacks and at lease one component including a polysilicon layer as a top surface. The method and system further include forming a silicide on the top surface of the polysilicon layer and providing an insulating layer covering the plurality of gate stacks, the at least one component and the silicide. The method and system also include etching the insulating layer to provide at least one contact hole. The insulating layer etching step uses the silicide as an etch stop layer to ensure that the insulating etching step does not etch through the polysilicon layer. The method and system also include filling the at least one contact hole with a conductor.

1 Claim, 5 Drawing Sheets

METHOD AND SYSTEM FOR PROVIDING CONTACT TO A FIRST POLYSILICON LAYER IN A FLASH MEMORY DEVICE

FIELD OF THE INVENTION

The present invention relates to flash memory devices, and more particularly to a method and system for providing contacts to the first polysilicon layer in the flash memory devices.

BACKGROUND OF THE INVENTION

Flash memory devices are a popular form of nonvolatile storage. Flash memory devices can retain information when no power is supplied to the device. Flash memory devices include memory cells that include a gate stack, a source and a drain. Each gate stack also includes a control gate separated from the floating gate by an insulating layer. The insulating layer is typically a composite ONO layer including two oxide layers separated by a nitride layer. The control gate and the floating gate are typically formed of polysilicon. Some memory cells may be separated by field oxide regions. Contact is made to the source and drain regions as well as to the gate stacks In conventional flash memory devices, particularly in NAND technology, it may be desirable to provide other components using one of the polysilicon layers which form the floating gate and control gate. For example, the first polysilicon layer may be used to form resistors or other components for the flash memory device. Consequently, contacts are desired to be provided to the gate stacks, the source and drain regions and the components comprised of the first polysilicon layer.

FIG. 1 depicts a conventional method for providing a conventional flash memory device, such as a NAND device, that includes components, other than the gate stacks, which use one of the polysilicon layers. For clarity, it is assumed that the first polysilicon layer is used. Such components will also be called poly-1 components. The gate stacks, source and drain regions and poly-1 components are formed, via step 12. Typically, step 12 includes forming field oxide regions, depositing a first polysilicon layer, forming the ONO layer, patterning the ONO and first polysilicon layers, depositing a second polysilicon layer with the poly-1 component already patterned, and etching the second polysilicon layer and ONO layer to form the gate stacks and the poly-1 component. Step 12 also typically includes implanting the source and drain regions. From the perspective of contact formation, source and drain regions are similar. Consequently, all such regions are referred to as source/drain regions. Often, step 12 also includes forming a silicide, usually a tungsten-silicide, on the gate stacks and providing a capping layer including SiON on the gate stack.

An insulating layer is then formed, via step 14. The insulating layer covers the source/drain regions, the gate stacks, the field oxide regions and the poly-1 components. Contact holes are then etched, via step 16, to allow electrical contact to the gate stacks, the source/drain regions, and the poly-1 components. Typically, the contact holes for the gate stacks, the source/drain regions, and the poly-1 components are etched simultaneously. The contact holes may then be filled with a conductive material, via step 18.

Although the conventional method 10 functions, one of ordinary skill in the art will readily realize that it is difficult to provide contact to the poly-1 components using the conventional method 10. FIGS. 2A and 2B depict a conventional flash memory device 50 fabricated using the conventional method 10. FIG. 2A depicts the conventional flash memory device 50 prior to formation of contact holes. The conventional flash memory device 50 includes a substrate 52 on which a gate stack 60, source/drain regions 56 and 58, oxide layer 55 and field oxide 54 are formed. The gate stack 60 includes a floating gate 62, an insulating layer 64, a control gate 66, a tungsten silicide layer 68 and a SiON layer 70. Spacers 72 and 74 can be formed on opposite sides of the gate stack 60. The floating gate 62 and control gate 66 are formed from first and second polysilicon layers, respectively. The insulating layer 64 is typically an ONO layer 64, which includes two layers of oxide separated by a nitride layer. Also depicted is a poly-1 component 76 which includes a polysilicon layer 76 and happens to be located on the field oxide region 54. On the poly-1 component 76 is an ONO layer 78. The poly-1 component 76 may be formed using the first polysilicon layer. Similarly, the ONO layer 78 may be formed using the same ONO layer that forms the ONO layer 64. Blanketing the gate stack 60, the source/drain regions and the poly-1 component is an insulating layer 80, which is typically formed of oxide.

FIG. 2B depicts the conventional flash memory device 50 after the contact holes have been etched using step 16 of the method 10. Referring back to FIG. 2B, the contact holes 82, 84, and 86 are of very different depths. The contact hole 82 to the gate stack 60 is the shallowest. The contact hole 84 to the source/drain region 56 is the deepest. The contact hole 86 to the poly-1 component 76 has a medium depth. Typically, the contact holes 82, 84 and 86 are etched concurrently. Furthermore, because the percentage of area occupied by the contact holes 82, 84 and 86 is small, endpoint detection using conventional techniques is difficult. Consequently, some overetch is usually performed.

Because of the etch used to form the contact hole 82, 84 and 86, the poly-1 component 76 may be destroyed. The tungsten silicide layer 68 prevents the gate stack 60 from being etched through. The source/drain region 56 is the deepest to which contact is made and the etch stops at the silicon. Thus, the etch does not substantially harm the source/drain region 56. However, the poly-1 component 76 and the ONO layer 78 have been etched partially or wholly through. Consequently, the poly-1 component may be destroyed. The etch may even remove the field oxide region 54 under the poly-1 component 76. Removal of the field oxide region 54 could expose the underlying silicon substrate 52, which is undesirable. The conventional flash memory device 50 may, therefore, not operate as desired.

Accordingly, what is needed is a system and method for providing contacts to the poly-1 components without destroying the poly-1 components or underlying structures. The present invention addresses such a need.

SUMMARY OF THE INVENTION

The present invention provides a method and system for providing at least one contact in a flash memory device. The flash memory device includes a plurality of gate stacks and at lease one component including a polysilicon layer having a top surface. The method and system comprise forming a silicide on the top surface of the polysilicon layer and forming an insulating layer covering the plurality of gate stacks, the at least one component and the silicide. The method and system also comprise etching the insulating layer to provide at least one contact hole. The insulating layer etching step uses the silicide as an etch stop layer to ensure that the insulating layer etching step does not etch through the polysilicon layer. The method and system also comprise filling the at least one contact hole with a conductor.

According to the system and method disclosed herein, the present invention allows contact to be more easily made to components which are made from the first polysilicon layer.

DETAILED DESCRIPTION OF THE INVENTION

Figure 1:
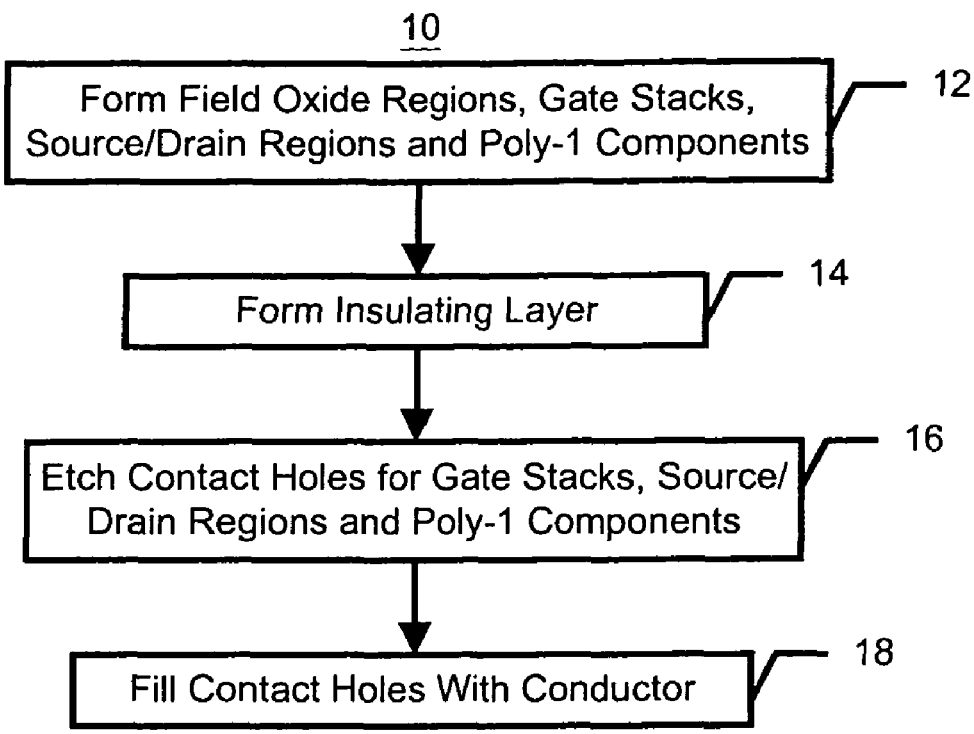
FIG. 1 is a flow-chart of a conventional method for forming contacts in a flash memory device.
Figure 2A:
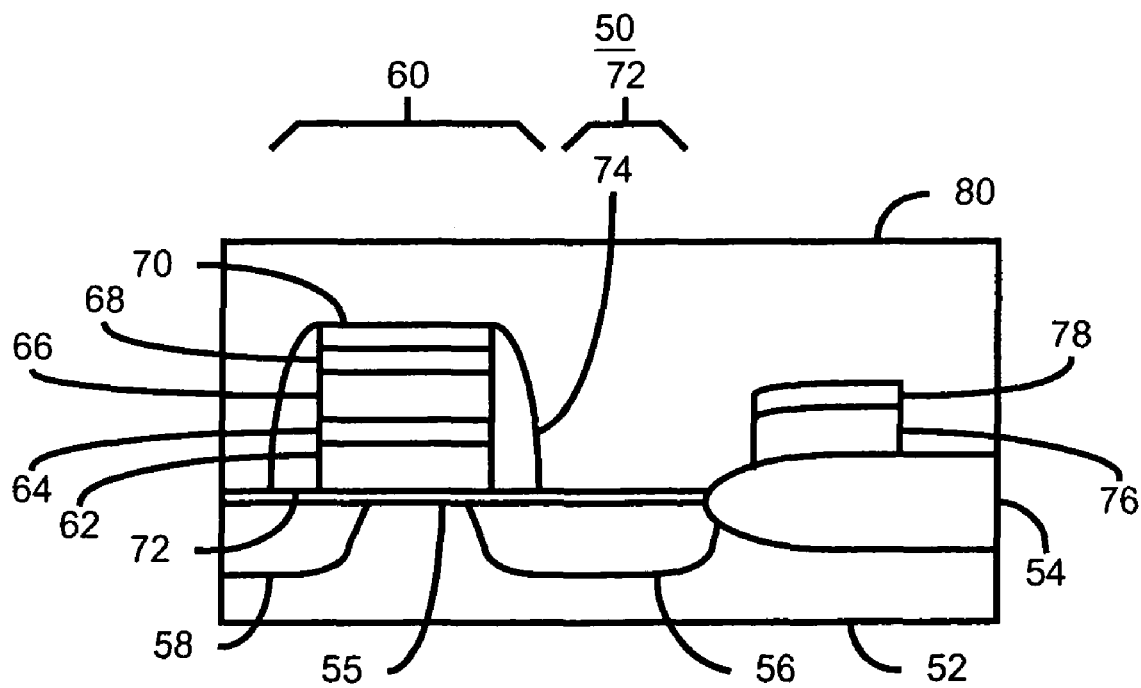
FIG. 2A is a diagram of a conventional flash memory device having a first polysilicon layer device prior to formation of contact holes.
Figure 2B:
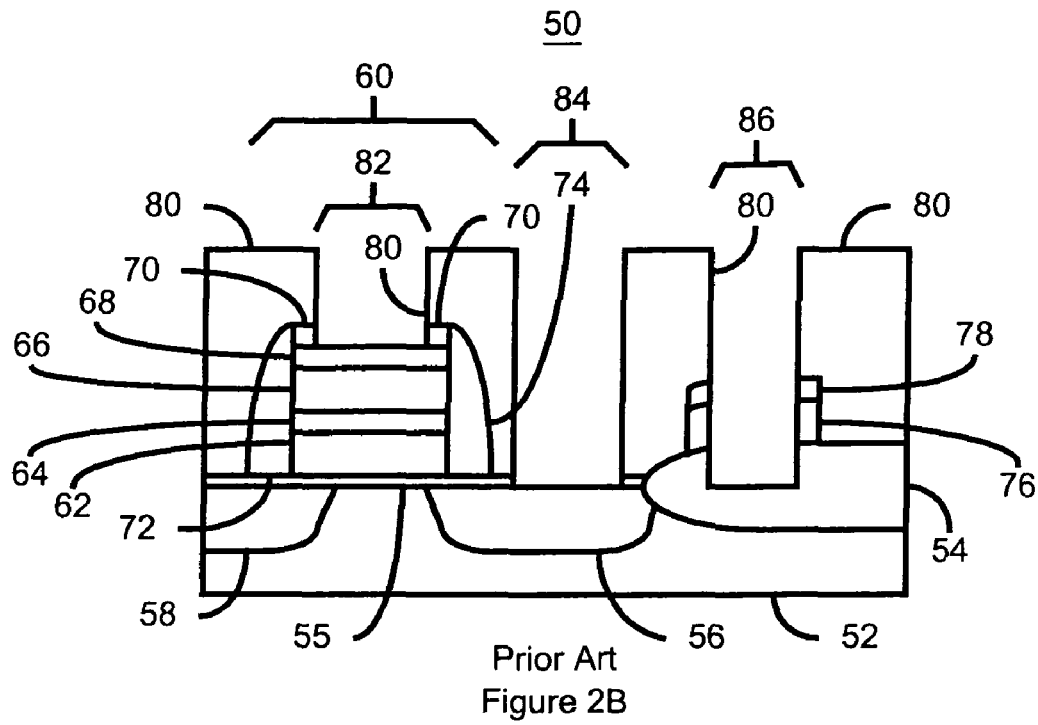
FIG. 2B is a diagram of a conventional flash memory device having a first to polysilicon layer device after formation of contact holes.

The present invention relates to an improvement in providing contacts in flash memory devices. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

Conventional flash memory devices are used for nonvolatile storage. It is desirable, for example in NAND technology, to utilize either the first or the second polysilicon layer for devices other than gate stacks. These devices which utilize the first polysilicon layer will be termed poly-1 components. However, one of ordinary skill in the art will readily realize that when contacts to the source/drain regions, the gate stacks and the poly-1 components are formed, the etch of the contact holes may destroy the poly-1 components and underlying structures, such as field oxides. Destruction of these portions of the flash memory device is undesirable.

The present invention provides a method and system for providing at least one contact in a flash memory device. The flash memory device includes a plurality of gate stacks and at lease one component including a polysilicon layer having a top surface. The method and system comprise forming a silicide on the top surface of the polysilicon layer and providing an insulating layer covering the plurality of gate stacks, the at least one component and the silicide. The method and system also comprise etching the insulating layer to provide at least one contact hole. The insulating layer etching step uses the silicide to ensure that the insulating etching step does not etch through the polysilicon layer. The method and system also comprise filling the at least one contact hole with a conductor.

The present invention will be described in terms of a particular flash memory cell having certain components. However, one of ordinary skill in the art will readily recognize that this method and system will operate effectively for flash memory cells having other components. The present invention will also be described in the context of certain methods for fabricating the flash memory device. However, one of ordinary skill in the art will readily realize that the method and system will operate for other fabrication methods. For the purpose of clarity, the present invention will also be described in the context of methods in which certain steps are omitted. However, one of ordinary skill in the art will readily realize that other steps may be used. The present invention is also discussed in the context of specific materials. One of ordinary skill in the art, however, will readily realize that the present invention is consistent with the use of other materials. For example, although termed field oxide regions, such regions can be made of insulating materials other than an oxide.

Figure 3A:
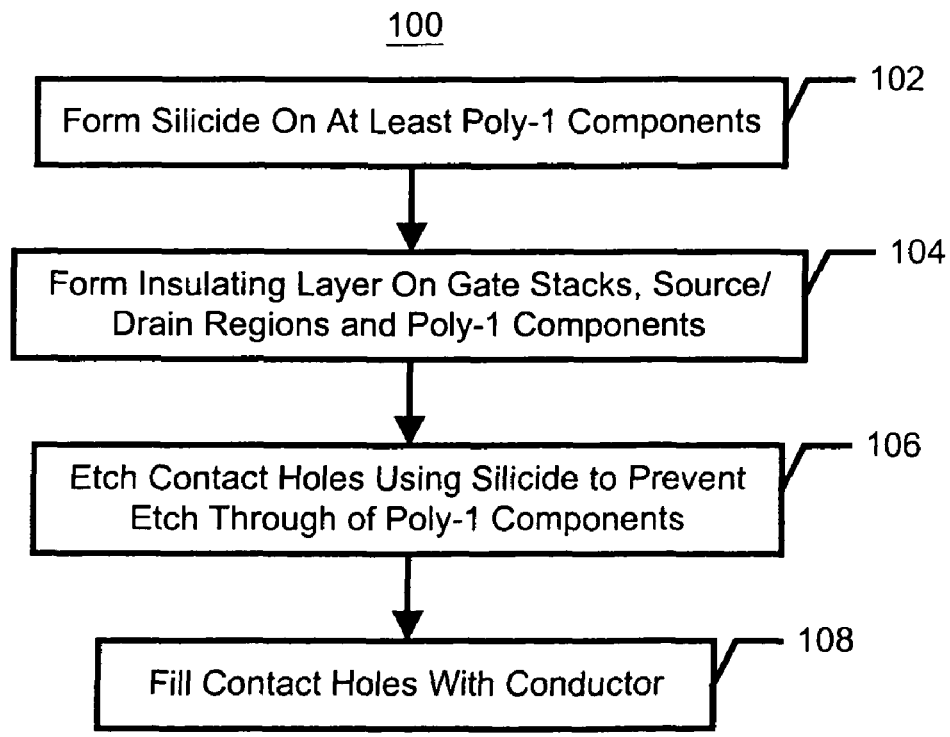
FIG. 3A is a flow chart of one embodiment of method in accordance with the present invention for providing contacts in a flash memory device.

To more particularly illustrate the method and system in accordance with the present invention, refer now to FIG. 3A, depicting one embodiment of a method 100 in accordance with the present invention for providing contact to at least poly-1 components. The method preferably commences after gate stacks, source/drain regions and the poly-1 components have been formed. The method 100 also preferably commences when the top surface of the polysilicon layer in the poly-1 component is clean and relatively free from surface oxides. A silicide is formed on at least the polysilicon layer of the poly-1 components, via step 102. Step 102 is preferably performed using a self-aligned silicide ("salicide") process. The silicide formed is preferably either a cobalt silicide or a titanium silicide. Titanium silicide may be desirable because the silicide can form despite a thin layer of oxide on a polysilicon layer. However, the cobalt silicide may also be desirable because the resistivity of the cobalt silicide is lower than that of tungsten silicide.

An insulating layer is formed over the poly-1 components, the gate stacks and the source-drain regions, via step 104. Contact holes are then etched, via step 106. Etching step uses the silicide layer formed in step 102 to prevent the poly-1 components from being etched through. The silicide layer is etched much slower than the insulating layer, which is usually an oxide. Preferably, the contact holes to the poly-1 components, the source/drain regions and the gate stacks are preferably etched concurrently. The silicide layer on the surface of the poly-1 component thus acts as an etch-stop layer and prevents damage to the poly-1 component even though overetching is performed and contact holes deeper than those to the poly-1 components are also formed. The contact holes are then filled with a conductor, via step 108. The silicide formed in step 102 aids in providing good electrical contact to the poly-1 components as well as protecting the poly-1 components during the contact hole etch.

Figure 3B:
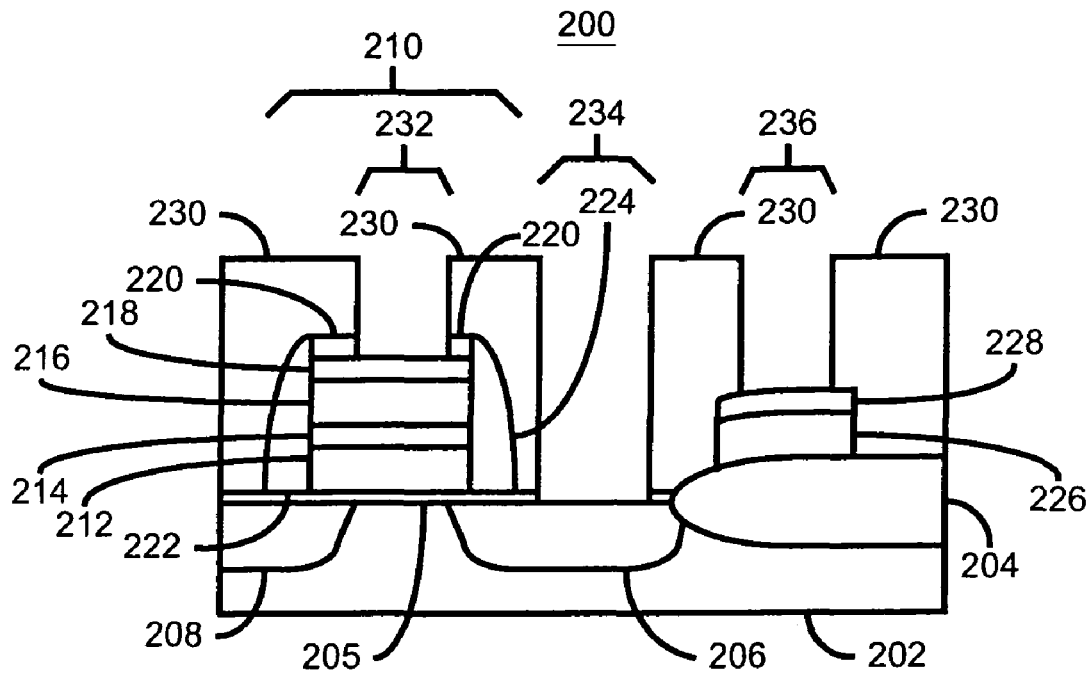
FIG. 3B is a diagram of one embodiment of a flash memory device in accordance with the present invention.

FIG. 3B depict one embodiment of a flash memory device 200 formed in accordance with the present invention. The flash memory device 200 includes a substrate 202 on which a gate stack 210, source/drain regions 206 and 208, oxide layer 205 and field oxide 204 are formed. The gate stack 210 includes a floating gate 212, an insulating layer 214, a control gate 216, an optional silicide layer 218 and a SiON layer 220. The silicide layer 218 may be a tungsten, titanium or cobalt silicide. Spacers 222 and 224 can be formed on opposite sides of the gate stack 210. The floating gate 212 and control gate 216 are formed from first and second polysilicon layers, respectively. The insulating layer 214 is typically an ONO layer 214, which includes two layers of oxide separated by a nitride layer.

Also depicted is a poly-1 component 226 which includes a polysilicon layer 226 and happens to be located on the field oxide region 204. In a preferred embodiment, the poly-1 component 226 would be formed using the first polysilicon layer. However, another layer of polysilicon could be used. On the poly-1 component 226 is a silicide layer 228 formed in accordance with the present invention. Blanketing the gate stack 210, the source/drain regions 206 and 208 and the poly-1 component 226 is an insulating layer 230, which is generally formed of oxide. Contact holes 232, 234 and 236 have been etched into the insulating layer 230.

The contact holes 232, 234 and 236 have different depths. Furthermore, some overetch may have been performed to ensure that the contacts 232, 234 and 236 are to the desired depths. Because of the presence of the silicide layer 228, the poly-1 component 226 has not been etched during formation of the contact hole 236. Consequently, the poly-1 component 226 is still usable. Furthermore, the underlying field oxide region 204 remains intact. The silicide layer 228 also allows for better electrical contact to the poly-1 component 226 when a conductor (not shown) fills the contact hole 236. Furthermore, overetching can be performed to ensure that the contact holes 232, 234 and 236 also have the desired depth. Thus, the poly-1 components 226 can be used and the flash memory device 200 is operational.

Figure 4:
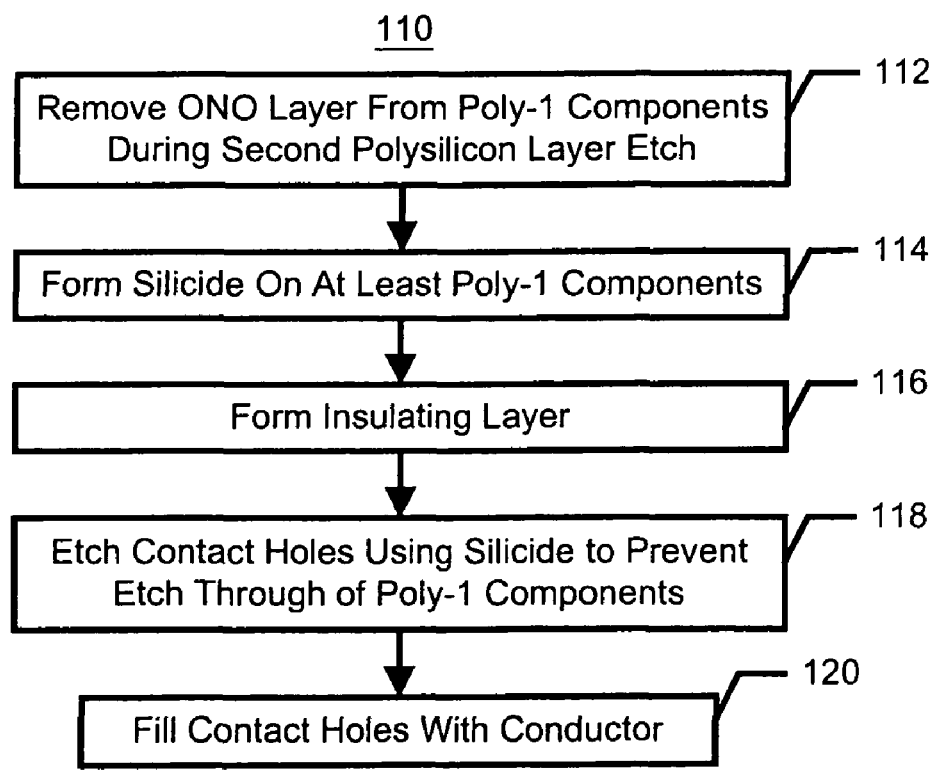
FIG. 4 is a flow chart depicting another embodiment of a method in accordance with the present invention for providing contacts in a flash memory device.

FIG. 4 depicts a more detailed flow chart of another embodiment of a method 110 for providing contacts to poly-1 components in accordance with the present invention. The method 110 preferably commences after formation of the poly-1 components, the gate stacks, the source drain regions, and the field oxide regions. The poly-1 component is often formed using the first polysilicon layer. A composite ONO layer generally covers the first polysilicon layer. When the poly-1 components are formed, therefore, they are covered by the ONO layer. The method 110, therefore commences by removing the ONO layer from the poly-1 components when the second polysilicon layer is etched to form the control gates, via step 112. The removal of the ONO layer during the second polysilicon layer etch should be performed carefully to ensure that any oxide above the source/drain regions is not completely removed. In an alternate embodiment, the ONO layer on the poly-1 components could be removed separately from the etch of the second polysilicon layer. For example, after the second polysilicon layer is etched forming the gate stacks, the active areas could be masked, and the ONO layer on the poly-1 components removed separately.

A silicide is then formed on the exposed surface of the polysilicon layer of the poly-1 component, via step 114. In a preferred embodiment, the silicide layer is formed using a salicide process. The silicide formed is preferably a cobalt silicide or a titanium silicide. Titanium silicide may be desirable because the silicide can form despite a thin layer of oxide on a polysilicon layer. However, the cobalt silicide may also be desirable because the resistivity of the cobalt silicide is lower than that of titanium silicide. In a preferred embodiment, a silicide is formed on both the poly-1 component and on the second polysilicon layer, or control gate, of the gate stack in step 114. As a result, a separate step for forming titanium silicide on the gate stack may be omitted. However, also in a preferred embodiment no silicide is formed on the source/drain regions to prevent the source/drain regions from shorting to the gate stacks.

An insulating layer is formed over the poly-1 components, the gate stacks and the source-drain regions, via step 116. Contact holes are then etched, via step 118. Etching step uses the silicide layer formed in step 114 to prevent the poly-1 components from being etched through. The silicide layer is etched much slower than the insulating layer, which is usually an oxide. Preferably, the contact holes to the poly-1 components, the source/drain regions and the gate stacks are preferably etched concurrently. The silicide layer on the surface of the poly-1 component thus prevents damage to the poly-1 component even though overetching is performed and contact holes deeper than those to the poly-1 components are also formed. The contact holes are then filled with a conductor, via step 120. The silicide formed in step 102 aids in providing good electrical contact to the poly-1 components as well as protecting the poly-1 components during the contact hole etch.

Figure 5A:
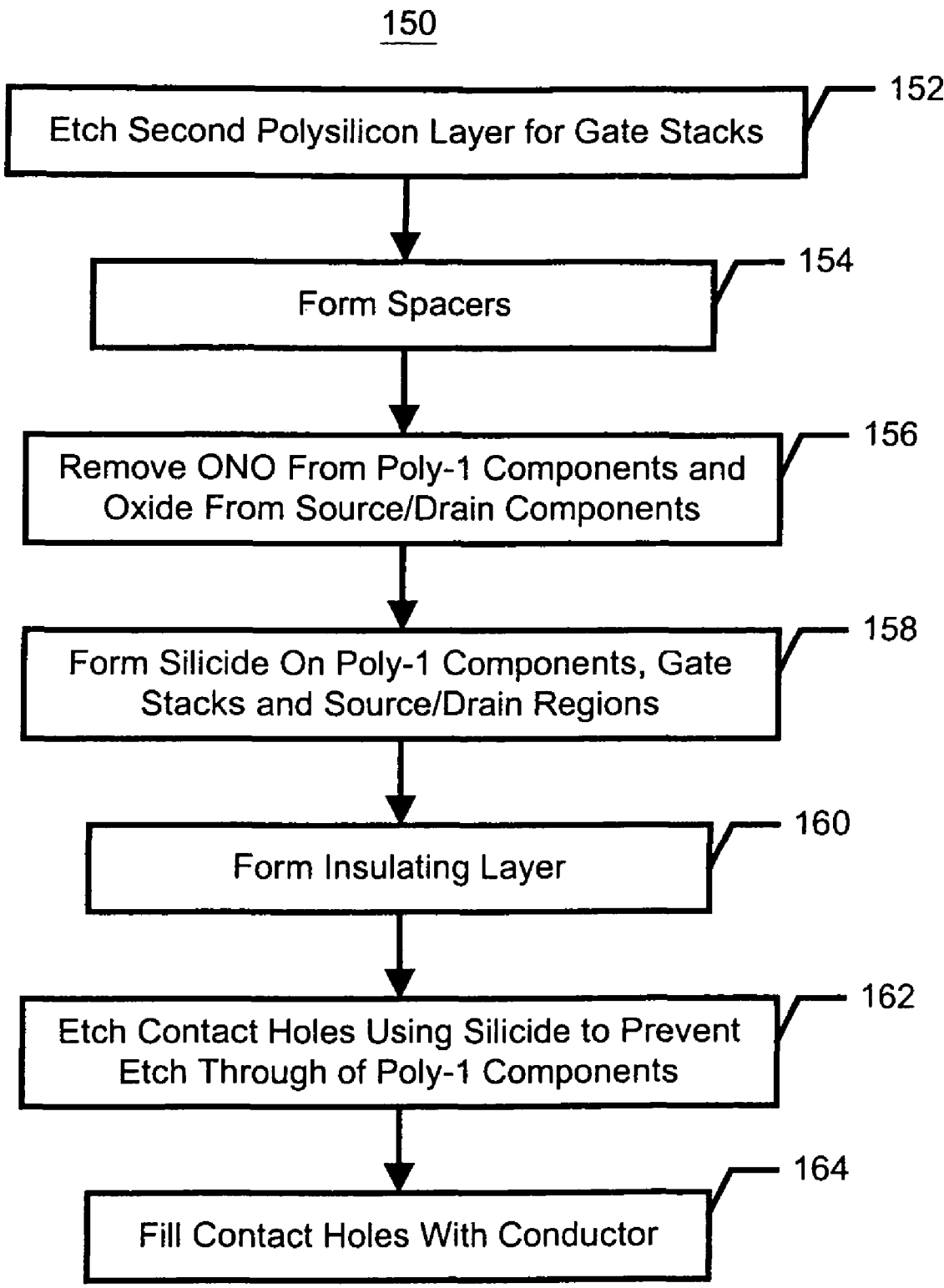
FIG. 5A is a flow chart of another embodiment of method in accordance with the present invention for providing contacts in a flash memory device.

FIG. 5A depicts another embodiment of a method 150 for providing contacts to a poly-1 component in a flash memory device. As in the method 110 described in FIG. 4, the method 150 preferably commences after formation of the poly-1 components, the layers forming the gate stacks, the source/drain regions, and the field oxide regions. The poly-1 component is often formed using the first polysilicon layer. A composite ONO layer generally covers the first polysilicon layer. When the poly-1 components are formed, therefore, they are covered by the ONO layer. The second polysilicon layer is etched to form the control gates of the gate stacks, via step 152. Spacers are then formed along edges of the gate stack, via step 154. The spacers formed in step 154 are insulating spacers. The ONO layer on the poly-1 components and, in a preferred embodiment, the oxide layer on certain source/drain regions is removed, via step 156. Preferably, step 156 includes etching the ONO layer and the oxide layer. A silicide is formed on the poly'1 components, via step 158. In a preferred embodiment, a silicide layer is also formed on the tops of the gate stacks on the source/drain regions in step 158. The silicide layer is preferably formed using a salicide process. An insulating layer is then formed, via step 160. The insulating layer covers the poly-1 components, the gate stacks, the source/drain regions, field oxide regions and the corresponding silicide layers. Contact holes are etched in the insulating layer, via step 162.

Figure 5B:
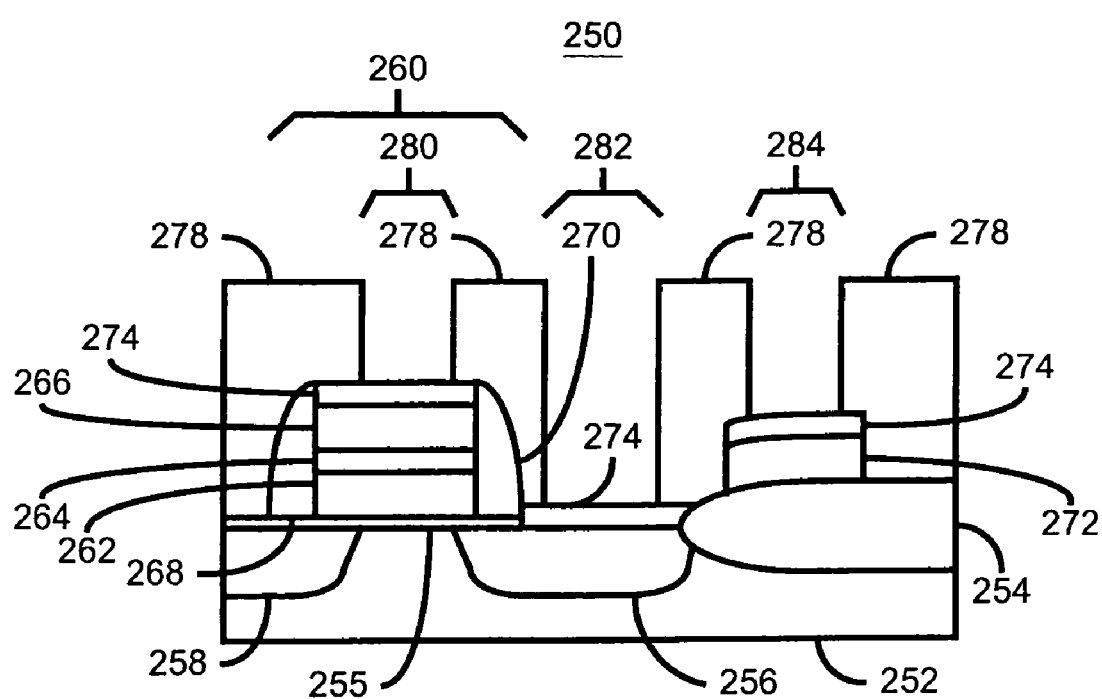
FIG. 5B is a diagram of another embodiment of a flash memory device in accordance with the present invention.

FIG. 5B depict one embodiment of a flash memory device 250 formed in accordance with the method 150. The flash memory device 250 includes a substrate 252 on which a gate stack 260, source/drain regions 256 and 258, oxide layer 255 and field oxide 254 are formed. The gate stack 260 includes a floating gate 262, an insulating layer 264, and a control gate 266. Spacers 268 and 270 can be formed on opposite sides of the gate stack 260. The floating gate 262 and control gate 266 are formed from first and second polysilicon layers, respectively. The insulating layer 264 is typically an ONO layer. Also depicted is a poly-1 component 272 which includes a polysilicon layer 272 and happens to be located on the field oxide region 254. In a preferred embodiment, the poly-1 component 272 would be formed using the first polysilicon layer. However, another layer of polysilicon could be used. On the poly-1 component 272 is a silicide layer 274 formed in accordance with the present invention. In addition, the silicide layer 274 covers source/drain region 236 and control gate 266. However, because the silicide layer 274 was formed after the spacers 268 and 270, the silicide layer 274 on the source/drain region 256 will not short the source drain region 256 to the gate stack 260. Blanketing the gate stack 260, the source/drain regions 256 and 258 and the poly-1 component 272 is an insulating layer 278, which is generally formed of oxide. Contact holes 280, 282 and 284 have been etched into the insulating layer 278.

The contact holes 280, 282 and 284 have different depths. Furthermore, some overetch may have been performed to ensure that the contacts 280, 282 and 284 are to the desired depths. Because of the presence of the silicide layer 274, the poly-1 component 272 has not been etched during formation of the contact hole 284. Consequently, the poly-1 component 272 is still usable. Furthermore, the underlying field oxide region 254 remains intact. The silicide layers 274 also allows for better electrical contact to the poly-1 component 272, the source/drain region 256 and the gate stack 260 when a conductor (not shown) fills the contact holes 280, 282, and 284. Furthermore, overetching can be performed to ensure that the contact holes 280, 282 and 284 also have the desired depth. Thus, the poly-1 components 272 can be used and the flash memory device 250 is operational. Moreover, good contact can be made relatively easily to the source/drain region 256 and the gate stack 260 in addition to the poly-1 component because of the presence of the silicide layer 274.

A method and system has been disclosed for providing contacts to a poly-1 component in a flash memory device. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A flash memory device, comprising:
   an oxide layer;
   a gate stack formed on said oxide layer, wherein said gate stack comprises:
      a first polysilicon layer;
      an insulating layer formed on said first polysilicon layer; and
      a second polysilicon layer formed on said insulating layer;
   a field oxide region located adjacent to said oxide layer;
   a component located on said field oxide region, wherein said component is formed from one of said first and said second polysilicon layer; and
   a silicide layer formed on said component;
   wherein said component comprises a resistor.

* * * * *